(12) United States Patent
Roham

(10) Patent No.: US 12,028,057 B2
(45) Date of Patent: Jul. 2, 2024

(54) RECEIVERS FOR HIGH DENSITY AND LOW LATENCY CHIP-TO-CHIP LINKS

(71) Applicant: QUALCOMM Incorporated, San Diego, CA (US)

(72) Inventor: Masoud Roham, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/951,790

(22) Filed: Sep. 23, 2022

(65) Prior Publication Data

US 2024/0106431 A1    Mar. 28, 2024

(51) Int. Cl.
| | |
|---|---|
| *H03K 17/56* | (2006.01) |
| *H03H 7/06* | (2006.01) |
| *H03K 19/20* | (2006.01) |

(52) U.S. Cl.
CPC ............ *H03K 17/56* (2013.01); *H03H 7/06* (2013.01); *H03K 19/20* (2013.01)

(58) Field of Classification Search
CPC ........ H03F 3/2171; H03F 1/34; H03F 1/3205; H03F 1/301; G11C 7/1084; G11C 7/1054
See application file for complete search history.

(56) References Cited

U.S. PATENT DOCUMENTS

| | | | |
|---|---|---|---|
| 6,140,857 A | 10/2000 | Bazes | |
| 7,609,756 B2 | 10/2009 | Wood | |
| 7,834,710 B2 * | 11/2010 | Yajima | H03B 5/364 331/158 |
| 8,188,763 B2 | 5/2012 | Bertin et al. | |
| 9,209,789 B1 | 12/2015 | Li et al. | |
| 9,800,218 B1 | 10/2017 | Rasmus | |
| 9,806,687 B2 | 10/2017 | Valli et al. | |
| 10,014,036 B1 | 7/2018 | Zhou et al. | |
| 10,156,590 B1 | 12/2018 | Reindel et al. | |
| 10,469,061 B1 * | 11/2019 | Lin | H03K 5/1506 |
| 2003/0157914 A1 | 8/2003 | Li et al. | |
| 2006/0186959 A1 * | 8/2006 | Arques | H03F 1/223 330/277 |
| 2008/0057900 A1 | 3/2008 | Fang et al. | |
| 2008/0063091 A1 | 3/2008 | Dong et al. | |
| 2009/0268767 A1 | 10/2009 | Nelson | |
| 2016/0013955 A1 | 1/2016 | Dong | |

(Continued)

FOREIGN PATENT DOCUMENTS

WO    2007033305 A2    3/2007

OTHER PUBLICATIONS

Boser B., "Offset Control", EECS 247 Lecture 27, A/D, DSP, University of California at Berkeley, 2002, 15 Pages.

(Continued)

*Primary Examiner* — Quan Tra
*Assistant Examiner* — Anh-Quan Tra
(74) *Attorney, Agent, or Firm* — Loza & Loza, LLP

(57) ABSTRACT

A system includes a receiver. The receiver includes an input stage having an input and an output, and a first resistor coupled between the output of the input stage and the input of the input stage. The receiver also includes an output stage having an input and an output, wherein the input of the output stage is coupled to the output of the input stage, and a feedback path coupled between the output of the output stage and the input of the input stage, the feedback path including a second resistor.

35 Claims, 9 Drawing Sheets

(56) References Cited

U.S. PATENT DOCUMENTS

2016/0173299 A1    6/2016    Islam et al.
2017/0093525 A1    3/2017    Navid
2023/0051839 A1*  2/2023    Sahota .................. H03H 11/42

OTHER PUBLICATIONS

Dehlaghi B., et al., "A 0.3 pJ/bit 20 GB/s/Wire Parallel Interface for Die-to-Die Communication," IEEE Journal of Solid-State Circuits, vol. 51, No. 11, Nov. 2016, pp. 2690-2701.
Duque-Carrillo J.F., et al., "Fully Differential Basic Building Blocks Based on Fully Differential Difference Amplifiers With Unity-Gain Difference Feedback", IEEE Transactions on Circuits and Systems, Part 1: Regular Papers, Mar. 1, 1995, vol. 42, No. 3, XP000510191, ISSN: 1057-7122, DOI: 10.1109/81 .376865, pp. 190-192.
Sackinger E., et al., "A Verstile Building Block: the CMOS Differential Difference Amplifier", IEEE Journal of Solid-State Circuits, vol. 22, No. 2, Apr. 1, 1987, XP000195792, ISSN: 0018-9200, DOI: 10.1109/JSSC.1987.1052715, pp. 287-294.
International Search Report and Written Opinion—PCT/US2023/071321—ISA/EPO—Nov. 7, 2023.

* cited by examiner

US 12,028,057 B2

RECEIVERS FOR HIGH DENSITY AND LOW LATENCY CHIP-TO-CHIP LINKS

BACKGROUND

Field

Aspects of the present disclosure relate generally to receivers, and, more particularly, to receivers for chip-to-chip links.

Background

Multiple chips (i.e., dies) may be packaged together in a multichip package or multichip module. For example, a first chip and a second chip may be packaged together with links between the chips to facilitate chip-to-chip communication between the chips. In this example, each of the chips may include one or more drivers for transmitting signals to the other one of the chips via one or more of the links, and each of the chips may include one or more receivers for receiving signals from the other one of the chips via one or more of the links.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a receiver, wherein the receiver includes an input stage having an input and an output, and a first resistor coupled between the output of the input stage and the input of the input stage. The receiver also includes an output stage having an input and an output, wherein the input of the output stage is coupled to the output of the input stage, and a feedback path coupled between the output of the output stage and the input of the input stage, the feedback path including a second resistor.

A second aspect relates to a system. The system includes a first chip, wherein the first chip includes a driver having an input and an output, and a first pad coupled to the output of the driver. The system also includes a second chip, wherein the second chip includes a second pad, and a receiver having an input and an output, wherein the input of the receiver is coupled to the second pad. The receiver includes an input stage having an input and an output, a first resistor coupled between the output of the input stage and the input of the input stage, an output stage having an input and an output, wherein the input of the output stage is coupled to the output of the input stage, and a feedback path coupled between the output of the output stage and the input of the input stage, the feedback path including a second resistor. The system also includes a link coupled between the first pad and the second pad.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
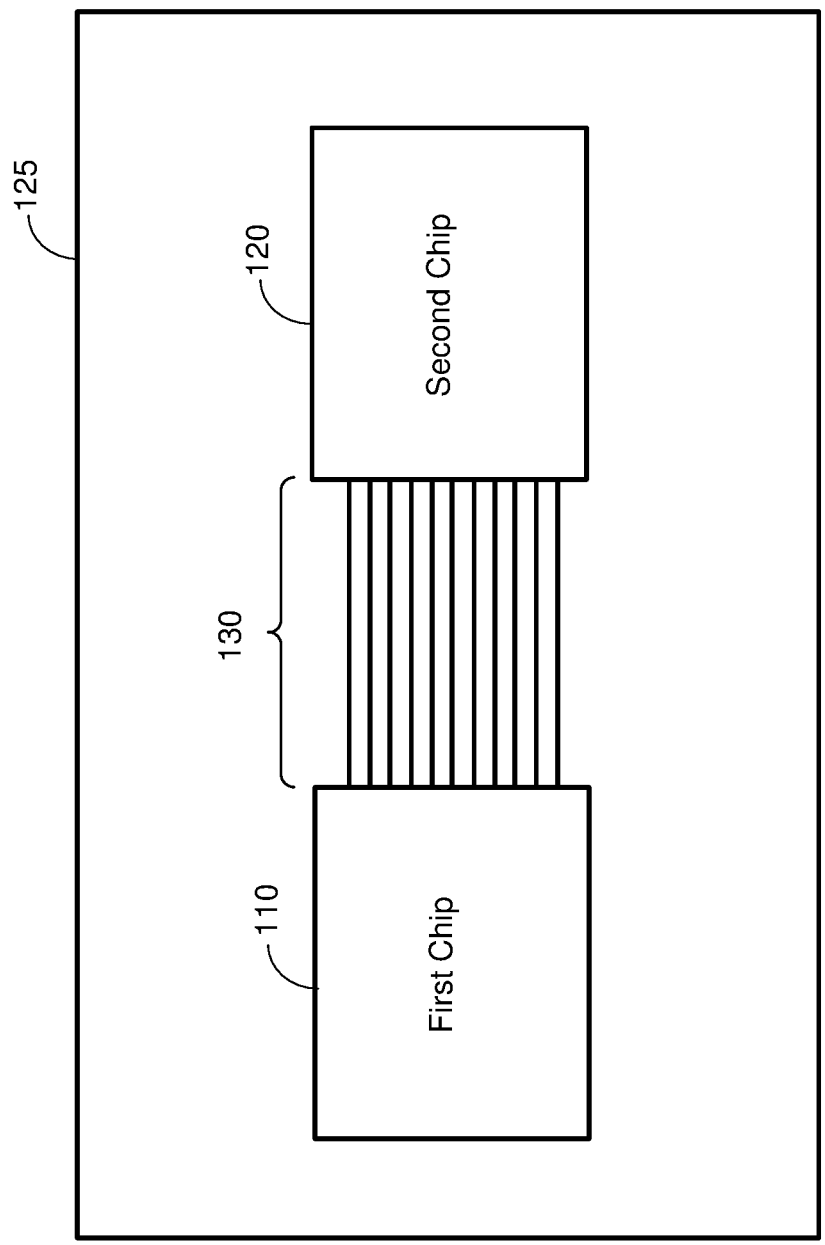
FIG. 1 shows an example of multiple chips according to certain aspects of the present disclosure.

Multiple chips (i.e., dies) may be packaged together in a multichip package or multichip module. In this regard, FIG. 1 shows an example of a first chip 110 and a second chip 120 that are packaged together. The first chip 110 and the second chip 120 may be mounted on a common substrate 125 (e.g., a printed circuit board, a ceramic substrate, etc.). FIG. 1 also shows multiple links 130 coupled between the first chip 110 and the second chip 120 to facilitate chip-to-chip (i.e., die-to-die) communication between the chips 110 and 120. The links 130 may include metal traces on the substrate 125 and/or metal traces embedded in the substrate 125. In this example, each of the chips 110 and 120 may include one or more drivers for transmitting signals to the other one of the chips 110 and 120 via one or more of the links 130, and each of the chips 110 and 120 may include one or more receivers for receiving signals from the other one of the chips 110 and 120 via one or more of the links 130.

Figure 2:
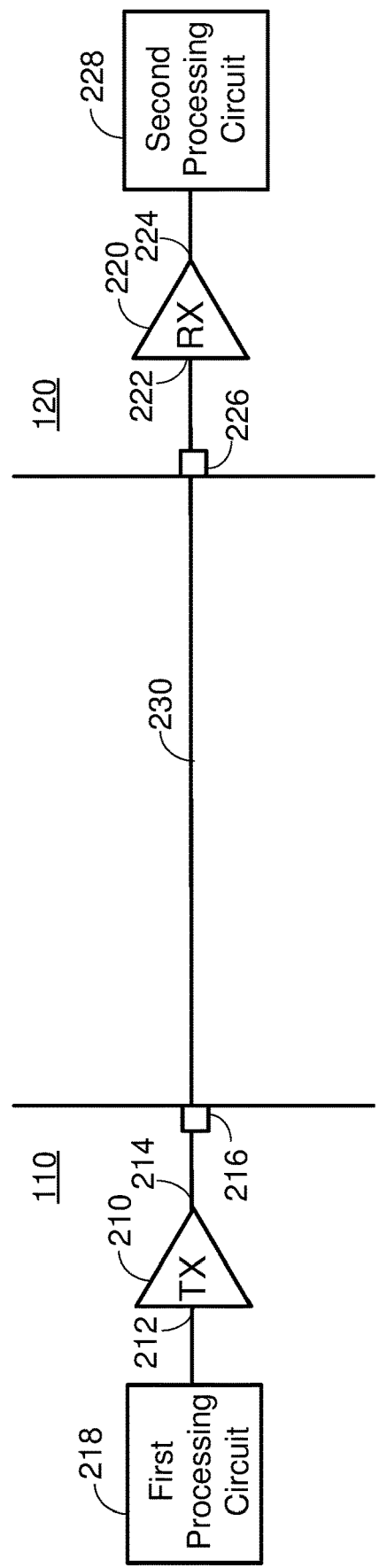
FIG. 2 shows an example of a driver, a receiver, and a link between the driver and the receiver according to certain aspects of the present disclosure.

FIG. 2 shows an example of chip-to-chip communication via a link 230 from among the multiple links 130 shown in FIG. 1. In this example, the first chip 110 includes a driver 210 (i.e., a transmitter), a first processing circuit 218 coupled to the input 212 of the driver 210, and a first pad 216 coupled to the output 214 of the driver 210. The second chip 120 includes a receiver 220, a second processing circuit 228 coupled to the output 224 of the receiver 220, and a second pad 226 coupled to the input 222 of the receiver 220. One end of the link 230 is coupled to the first pad 216, and the other end of the link 230 is coupled to the second pad 226.

In operation, the first processing circuit 218 receives data (e.g., bits), generates a data signal carrying the data, and outputs the data signal to the input 212 of the driver 210. The driver 210 receives the data signal, and transmits the data signal to the receiver 220 on the second chip 120 via the link 230. The receiver 220 receives the data signal at the input 222 of the receiver 220, amplifies the received data signal, and outputs the amplified signal to the second processing circuit 228.

In some implementations, the first and second processing circuits 218 and 228 may support serializer/deserializer (SerDes). In this example, the first processing circuit 218 is configured to receive the data in parallel data streams and serialize the data streams into the data signal, and the second processing circuit 228 is configured to receive the data signal from the receiver 220, and deserialize the data signal into parallel data streams. However, it is to be appreciated that the present disclosure is not limited to SerDes. It is to be appreciated that the first and second processing circuits 218 and 228 may perform encoding/decoding, and/or one or more other functions.

It is be appreciated that the driver 210, the link 230, and the receiver 220 are not limited to a data signal, and may be used to transfer a clock signal between the chips 110 and 120, or another type of signal.

Figure 3:
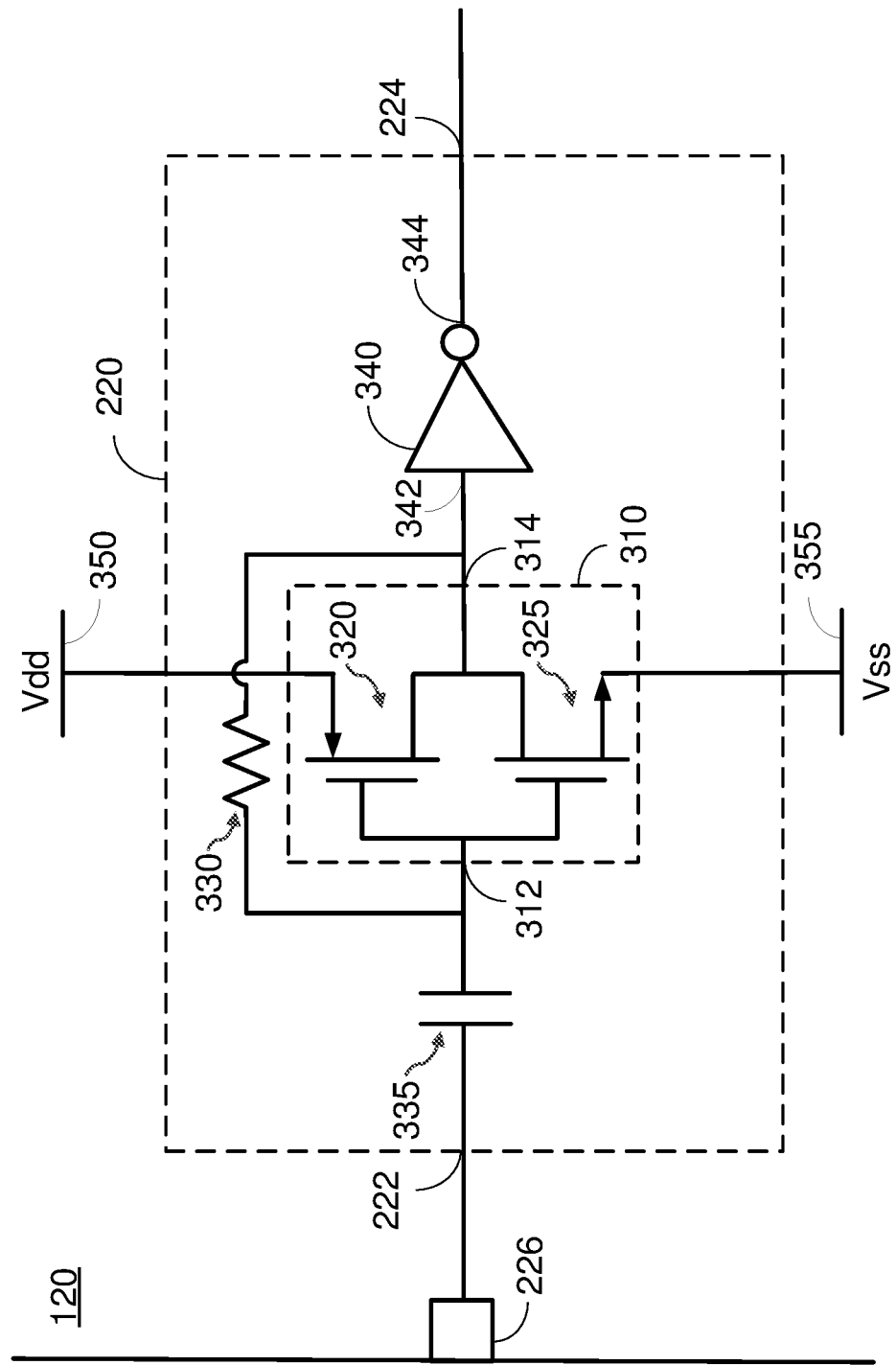
FIG. 3 shows an example of a receiver according to certain aspects of the present disclosure.

FIG. 3 shows an exemplary implementation of the receiver 220. In this example, the receiver 220 includes an input stage 310, an output stage 340 (also referred to as an output buffer), an alternating current (AC) coupling capacitor 335, and a feedback resistor 330. The AC coupling capacitor 335 is coupled between the input 222 of the receiver 220 and the input 312 of the input stage 310. The AC coupling capacitor 335 is configured to AC couple the data signal from the link 230 to the input 312 of the input stage 310. The AC coupling capacitor 335 may also simply be referred to as a coupling capacitor.

The input 342 of the output stage 340 is coupled to the output 314 of the input stage 310, and the output 344 of the output stage 340 is coupled to the output 224 of the receiver 220. It is to be appreciated that the receiver 220 may also include one or more intermediate stages (not shown in FIG. 3) coupled between the output 314 of the input stage 310 and the input 342 of the output stage 340. Also, in this example, the output stage 340 is inverting and may be implemented with one or more inverting circuits. However, it is to be appreciated that the present disclosure is not limited to this example.

In the example shown in FIG. 3, the input stage 310 is implemented with a complementary inverting circuit including a first transistor 320 and a second transistor 325. The source of the first transistor 320 is coupled to a supply rail 350, the drain of the first transistor 320 is coupled to the output 314 of the input stage 310, and the gate of the first transistor 320 is coupled to the input 312 of the input stage 310. The source of the second transistor 325 is coupled to a lower rail 355, the drain of the second transistor 325 is coupled to the output 314 of the input stage 310, and the gate of the second transistor 325 is coupled to the input 312 of the input stage 310. The supply rail 350 provides a supply voltage Vdd and the lower rail 355 is at a lower potential Vss than the supply voltage Vdd (e.g., the lower rail 355 may be coupled to ground). The supply rail 350 may also be referred to as a first rail and the lower rail may also be referred to as a second rail. In the example shown in FIG. 3, the first transistor 320 is implemented with a p-type field effect transistor (PFET), and the second transistor 325 is implemented with an n-type field effect transistor (NFET). However, it is to be appreciated that the present disclosure is not limited to this example.

The feedback resistor 330 is coupled between the input 312 and the output 314 of the input stage 310. In this example, the input stage 310 is self biased through the feedback resistor 330. For example, the input 312 of the input stage 310 may be biased to a bias voltage that is approximately equal to half the supply voltage Vdd of the supply rail 350 through the feedback resistor 330. Note that the AC coupling capacitor 335 blocks the bias voltage at the input 312 from the input 222 of the receiver 220.

In operation, the input 222 of the receiver 220 receives a data signal from the link 230 (shown in FIG. 3), amplifies the data signal, and outputs the amplified data signal at the output 224 of the receiver 220. To reduce power on the link 230, the driver 210 may transmit the data signal with a low voltage swing (e.g., 0.2V voltage swing). In this example, the AC coupling capacitor 335 couples the data signal to the input 312 of the input stage 310. In one example, the receiver 220 may amplify the data signal into a rail-to-rail output signal at the output 224 of the receiver 220 (e.g., an output signal with a voltage swing approximately equal to the supply voltage Vdd).

The AC coupling capacitor 335 AC couples the data signal to the input 312 of the input stage 310 (e.g., inverting circuit), in which the data signal shifts the voltage at the input 312 of the input stage 310 depending on the bit value represented by the data signal. For instance, for the example where the data signal has a low voltage swing of 0.2V, the data signal may shift the voltage at the input 312 of the input stage 310 to Vmid+0.1V for a bit value of one and shift the voltage at the input 312 of the input stage 310 to Vmid−0.1V for a bit value of zero, where Vmid is a bias voltage that is approximately equal to half the supply voltage Vdd. As discussed above, the feedback resistor 330 may self bias the input 312 of the input stage 310 to Vmid. In this example, the voltage Vmid+0.1V drives the output 314 of the input stage 310 low and the voltage Vmid−0.1V drives the output 314 of the input stage 310 high since the input stage 310 is implemented with an inverting circuit in this example.

A challenge with the receiver 220 shown in FIG. 3 is that, after a bit of the data signal shifts the voltage at the input 312 of the input stage 310 to Vmid+0.1V or Vmid−0.1V depending on the value of the bit, the input 312 of the input stage 310 may settle back to Vmid before the next bit transition. The settling back to Vmid may allow noise to toggle the output 314 of the input stage 310, causing the output 314 of the input stage 310 to go into an unknown state. The unknown state at the output 314 of the input stage 310 causes the output 224 of the receiver 220 to also go into an unknown state since the output state of the receiver 220 depends on the output 314 of the input stage 310.

The settling time at the input 312 of the input stage 310 depends on the resistance-capacitance (RC) time constant of the AC coupling capacitor 335 and the feedback resistor 330 (i.e., the RC time constant of the circuit formed by the AC coupling capacitor 335 and the feedback resistor 330). To prevent the output 224 of the receiver 220 from going into the unknown state before the next bit transition, the settling time may be increased by making the RC time constant relatively large (e.g., several unit intervals where a unit interval is the interval of one bit of the data signal). The long settling time prevents the input 312 of the input stage 310 from settling to Vmid before the next bit transition. The RC time constant may be made large, for example, by making the capacitance of the AC coupling capacitor 335 large, which increases the area of the AC coupling capacitor 335.

While the large RC time constant prevents the output 224 of the receiver 220 from going into the unknown state, the large RC time constant allows a relatively long stream of consecutive 1s or consecutive 0s in the data signal to cause a change in the characteristics of the input stage 310 resulting in inter symbol interference (ISI) problems where previous bits affect the current bit at the output 314. To mitigate ISI caused by a long stream of consecutive 1s or consecutive 0s, the first processing circuit 218 may include an encoder that encodes the data signal to balance the density of 1s and 0s, which limits the duration of consecutive 1s and 0s in the data signal. However, the encoding consumes additional power and increases latency. The large RC time constant may also make the input stage 310 more sensitive to supply noise.

To address the challenges of the receiver implementation shown in FIG. 3, aspects of the present disclosure provide a receiver with a small RC time constant and a built-in latch or hysteresis to hold the output state of the receiver until the next bit transition at the input of the receiver. As discussed further below, the small RC time constant mitigates ISI and supply noise while the built-in latch or hysteresis prevents the small RC time constant from causing the output of the receiver to go into an unknown state.

Figure 4:
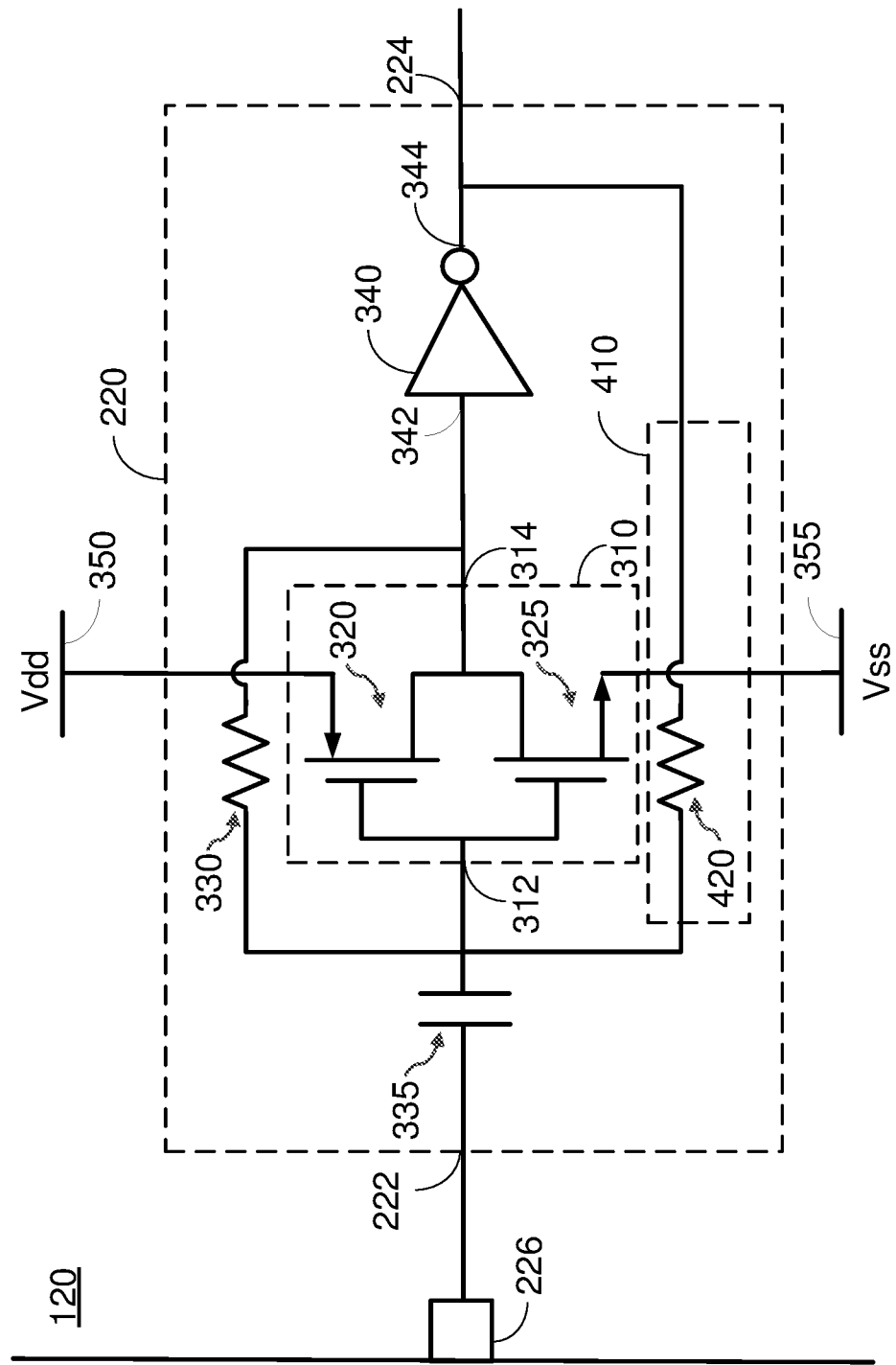
FIG. 4 shows an example of a receiver including a feedback path according to certain aspects of the present disclosure.

FIG. 4 shows an example of the receiver 220 according to aspects of the present disclosure. In this example, the RC time constant of the AC coupling capacitor 335 and the feedback resistor 330 (i.e., the RC time constant of the circuit formed by the AC coupling capacitor 335 and the feedback resistor 330) is relatively small to mitigate ISI. In certain aspects, the RC time constant may be as small as or smaller than one unit interval (UI) where a UI is the interval of one bit of the data signal. The small RC time constant reduces the settling time of the voltage at the input 312 of the input stage 310 (i.e., causes the voltage to settle faster). Since the voltage at the input settles within one UI in this example, the output 224 of the receiver 220 is not affected by previous bit patterns of the data signal, which significantly reduces ISI with no need for DC balancing or encoding the data signal to balance the density of 1s and 0s. In contrast, in the implementation illustrated in FIG. 3, the RC time constant is made large (e.g., several UIs) to increase the settling time of the voltage at the input 312 of the input stage 310.

The small RC time constant also allows the area of the AC coupling capacitor 335 to be significantly reduced compared with the area of the AC coupling capacitor 335 in FIG. 3. Also, the small RC time constant helps reject lower frequency device and supply noise.

However, as discussed above, a small RC time constant may cause the output 224 of the receiver 220 to go into an unknown state between bit transitions due to the quick settling time of the voltage at the input 312 of the input stage 310. To prevent the small RC time constant from causing the output 224 of the receiver 220 to go into an unknown state, the receiver 220 in this example includes a feedback path 410 between the output 344 of the output stage 340 and the input 312 of the input stage 310. The feedback path 410 provides built-in latch or hysteresis that holds the output state of the receiver 220 until the next bit transition at the input 222 of the receiver 220. In the example in FIG. 4, the feedback path 410 includes a second feedback resistor 420. However, the feedback path 410 is not limited to this example. In the discussion below, the feedback resistor 330 is referred to as the first feedback resistor 330.

Figure 5:
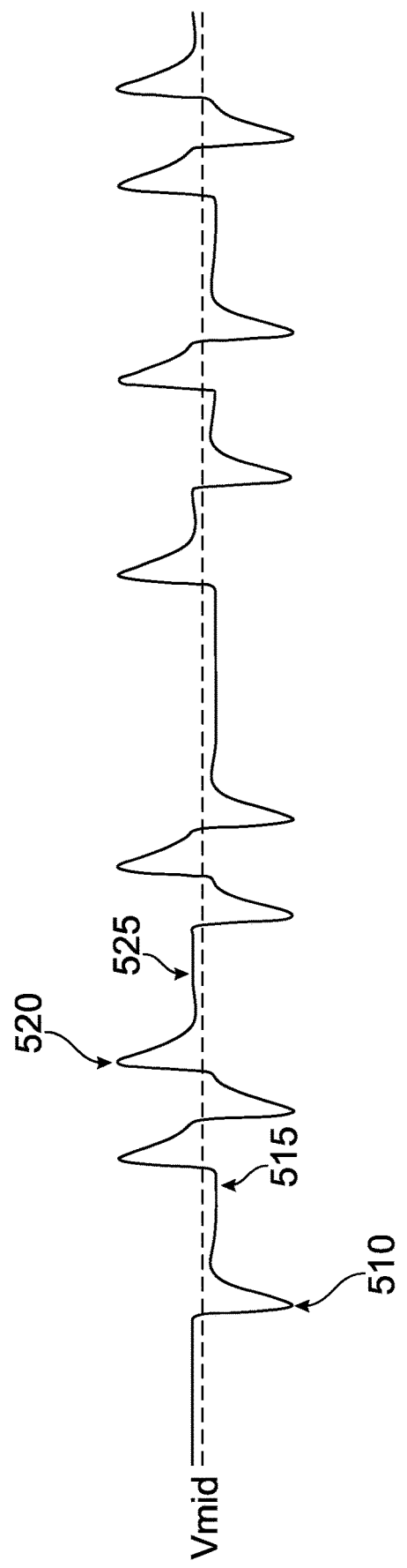
FIG. 5 is a voltage-time plot showing an example of a voltage at an input of an input stage of the receiver over time according to certain aspects of the present disclosure.

The built-in latch or hysteresis provided by the feedback path 410 may be explained using the example in FIG. 5. FIG. 5 is a voltage-time plot showing an example of the voltage at the input 312 of the input stage 310 over time. In this example, a zero bit of the data signal causes the voltage at the input 312 to shift downward 510, which drives the output 314 of the input stage 310 high. This produces a zero (e.g., a voltage corresponding to ground potential) at the output 224 of the receiver 220 since the output stage 340 is inverting in this example. After the downward shift, the voltage at the input 312 quickly settles due to the small RC time constant in this example. However, instead of settling to Vmid, the voltage at the input 312 of the input stage 310 settles to a voltage 515 that is below Vmid (indicated by the dashed line) due to the feedback path 410. The voltage 515 causes the output 224 of the receiver 220 to hold the zero until the next bit transition of the data signal. For example, the voltage 515 may be below Vmid by an amount that is large enough to prevent noise at the input 312 from toggling the output 224 of the receiver 220. Without the feedback path 410, the voltage at the input 312 of the input stage 310 would quickly settle to Vmid, which could cause the output 224 of the receiver 220 to go into an unknown state before the next bit transition.

In the example shown in FIG. 5, a one bit of the data signal causes the voltage at the input 312 of the input stage 310 to shift upward 520, which drives the output 314 of the input stage 310 low. This produces a one (e.g., Vdd) at the output 224 of the receiver 220 since the output stage 340 is inverting in this example. After the upward shift, the voltage quickly settles to a voltage 525 that is above Vmid (indicated by dashed line) due to the feedback path 410. The voltage 525 causes the output 224 of the receiver 220 to hold the one until the next bit transition of the data signal. For example, the voltage 525 may be above Vmid by an amount that is large enough to prevent noise at the input 312 from toggling the output 224 of the receiver 220. Without the feedback path 410, the voltage at the input 312 of the input stage 310 would quickly settle to Vmid, which could cause the output 224 of the receiver 220 to go into an unknown state before the next bit transition.

Thus, in this example, for a zero bit of the data signal, the feedback path 410 causes the voltage at the input 312 of the input stage 310 to settle to a voltage 515 that is below Vmid to hold the output 224 of the receiver 220 at zero until the next bit transition of the data signal (i.e., transition from zero to one). For a one bit of the data signal, the feedback path 410 causes the voltage at the input 312 of the input stage 310 to settle to a voltage 525 that is above Vmid to hold the output 224 of the receiver 220 at one until the next bit transition of the data signal (i.e., transition from one to zero).

The voltages 515 and 525 depend on a ratio of the resistance of the first feedback resistor 330 over the resistance of the second feedback resistor 420. More particularly, the amount by which the voltage 515 is below Vmid is increased by making the ratio larger and decreased by making the ratio smaller. Similarly, the amount by which the voltage 525 is above Vmid is increased by making the ratio larger and decreased by making the ratio smaller. Thus, the voltages 515 and 525 may be set to desired voltages by setting the ratio of the resistance of the first feedback resistor 330 over the resistance of the second feedback resistor 420 accordingly.

For example, the voltage 515 may be set to a voltage that is below Vmid by an amount that is large enough to hold a zero at the output 224 of the receiver 220 until the next bit transition of the data signal while not being too large that the voltage 515 prevents the next bit transition of the data signal from changing the logic state at the output 314 of the input stage 310. In one example, this may be achieved by making the ratio of the resistance of the first feedback resistor 330 over the resistance of the second feedback resistor 420 between 0.1 and 0.3. However, it is to be appreciated that the present disclosure is not limited to this example.

Also, the voltage 525 may be set to a voltage that is above Vmid by an amount that is large enough to hold a one at the output 224 of the receiver 220 until the next bit transition of the data signal while not being too large that the voltage 515 prevents the next bit transition of the data signal from changing the logic state at the output 314 of the input stage 310. In one example, this may be achieved by making the ratio of the resistance of the first feedback resistor 330 over the resistance of the second feedback resistor 420 between 0.1 and 0.3. However, it is to be appreciated that the present disclosure is not limited to this example.

As discussed above, the RC time constant of the first feedback resistor 330 and the coupling capacitor 335 (i.e., the RC time constant of the circuit formed by the first feedback resistor 330 and the coupling capacitor 335) may be as small as or smaller than one unit interval (UI) where a UI is the interval of one bit of the data signal. In certain aspects, the RC time constant may be equal to or less than one UI of the data signal. A UI may also be expressed as 1/f where f is the frequency of the data signal, or expressed as 1/r where r is the data rate of the data signal. In certain aspects, the first processing circuit 218 on the first chip 110 is configured to generate the data signal at the frequency or the data rate discussed above. In certain aspects, the first processing circuit 218 supports multiple frequencies or data rates. In these aspects, the UI discussed above may refer to the UI of the highest one of the multiple frequencies or data rates.

Figure 6:
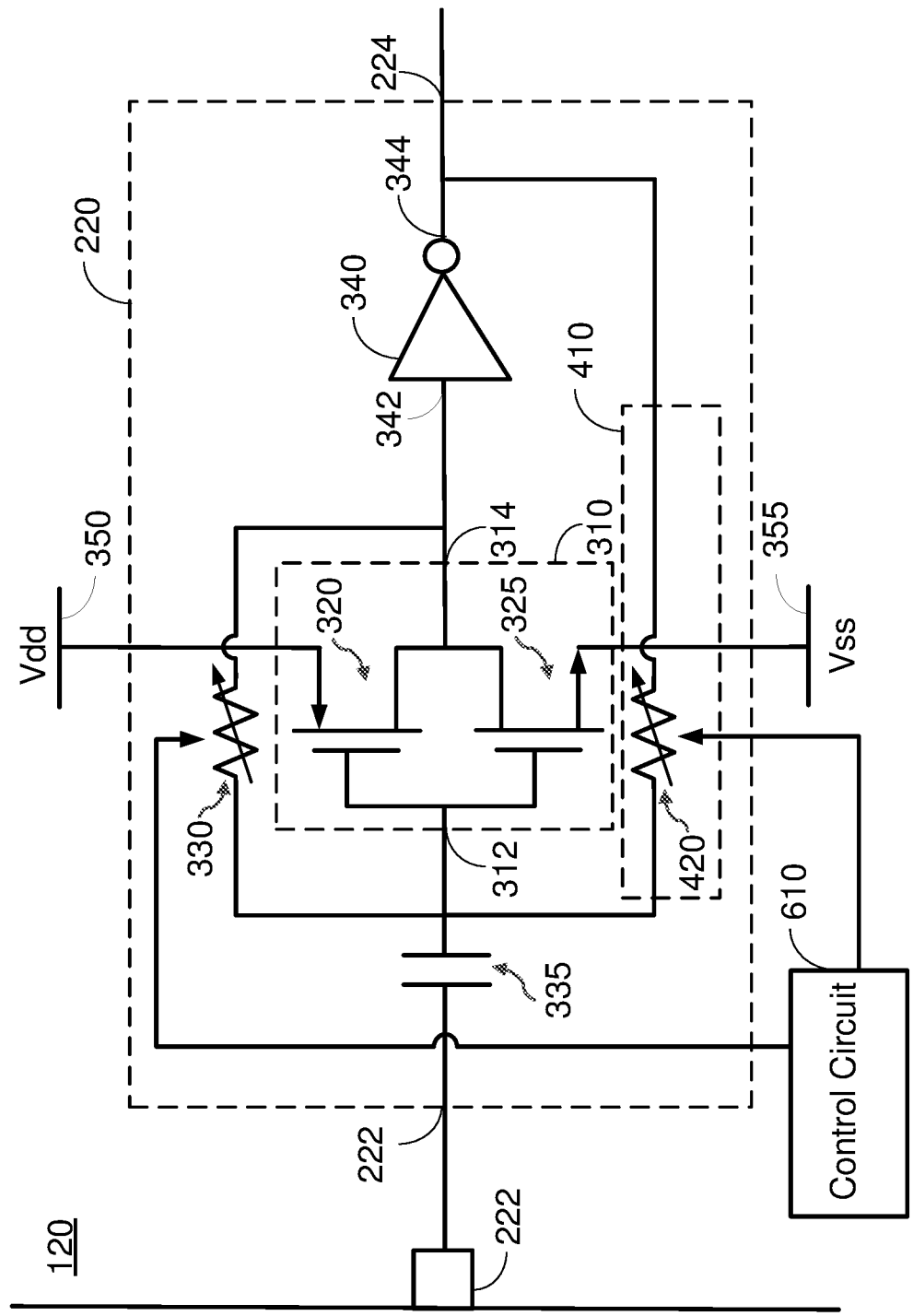
FIG. 6 shows an example of feedback resistors with programmable resistances according to certain aspects of the present disclosure.

In certain aspects, one or both of the feedback resistors 330 and 420 are programmable. In this regard, FIG. 6 shows an example in which the first feedback resistor 330 has a programmable resistance, and the second feedback resistor 420 has a programmable resistance. However, it is to be appreciated that the present disclosure is not limited to this example, and that, in another example, just one of the feedback resistors 330 and 420 may be programmable. In this example, each of the feedback resistors 330 and 420 may be implemented with a network of resistors and switches (e.g., digitally-controlled switches), or another type of programmable resistor.

In the example in FIG. 6, the second chip 120 includes a control circuit 610 configured to program the resistance of the first feedback resistor 330 and/or the resistance of the second feedback resistor 420. As discussed above, the voltages 515 and 525 depend on the ratio of the resistance of the first feedback resistor 330 over the resistance of the second feedback resistor 420. Therefore, the control circuit 610 may adjust the voltages 515 and 525 by adjusting resistance of the first feedback resistor 330 and/or the resistance of the second feedback resistor 420 accordingly.

Figure 7:
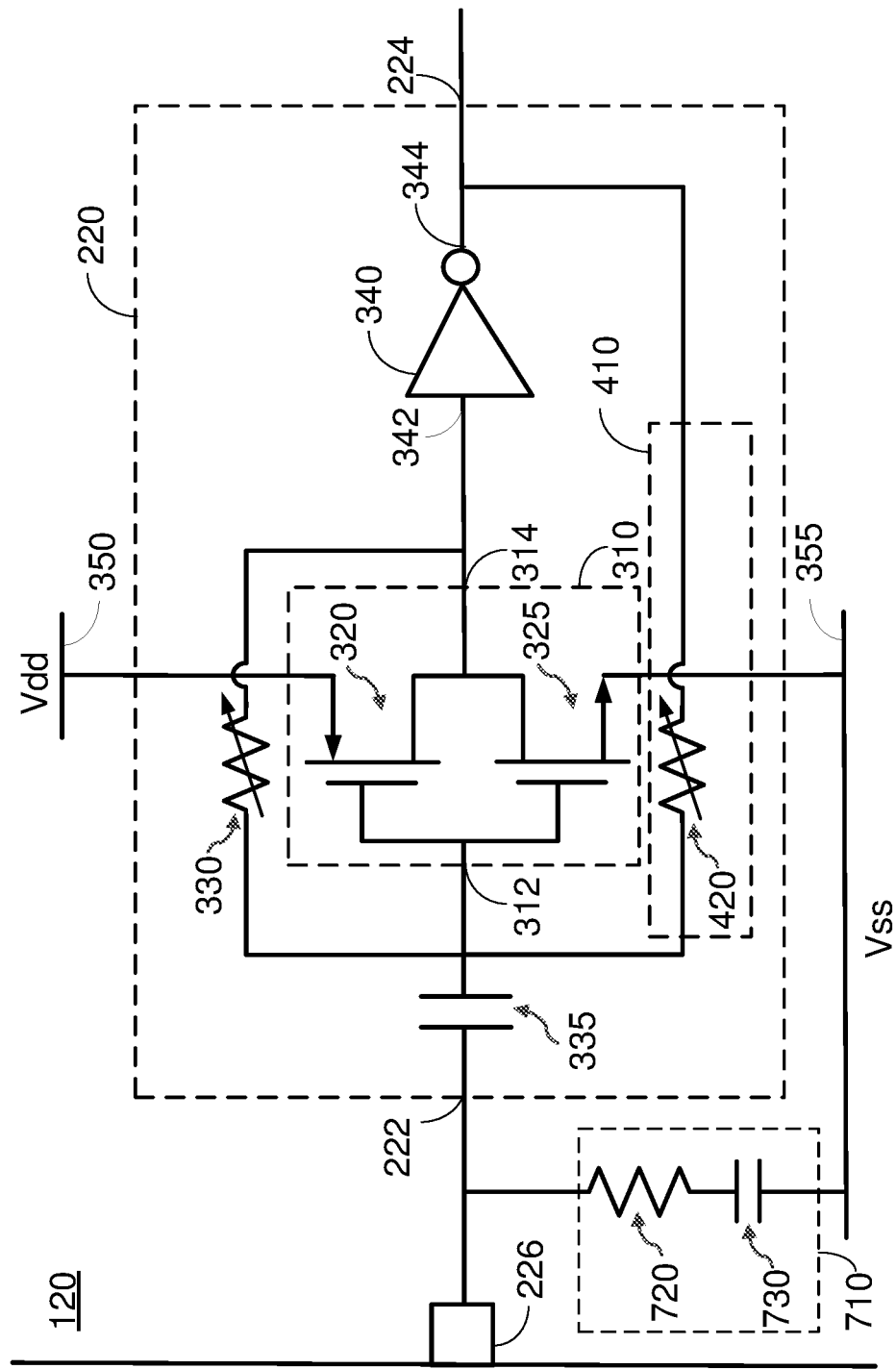
FIG. 7 shows an example of a termination circuit according to certain aspects of the present disclosure.

FIG. 7 shows an example in which the second chip 120 further includes a termination circuit 710 according to certain aspects. The termination circuit 710 is coupled between the input 222 of the receiver 220 and the lower rail 355 (e.g., ground). In certain aspects, the termination circuit 710 is configured to provide impedance matching between the input 222 of the receiver 220 and the link 230.

The termination circuit 710 includes a termination resistor 720 and an AC coupling capacitor 730. The termination resistor 720 and the AC coupling capacitor 730 are coupled in series between the input 222 of the receiver 220 and the lower rail 355 (e.g., ground). The AC coupling capacitor 730 AC couples the termination resistor 720 to the lower rail 355 to provide impedance matching for the data signal. In certain aspects, the resistance of the termination resistor 720 may be chosen to match the characteristic impedance (e.g., 50 Ohms) of the link 230. The AC coupling capacitor 730 helps prevent the termination circuit 710 from consuming direct current (DC) power by appearing as an open circuit to DC, thereby reducing power consumption.

Figure 8:
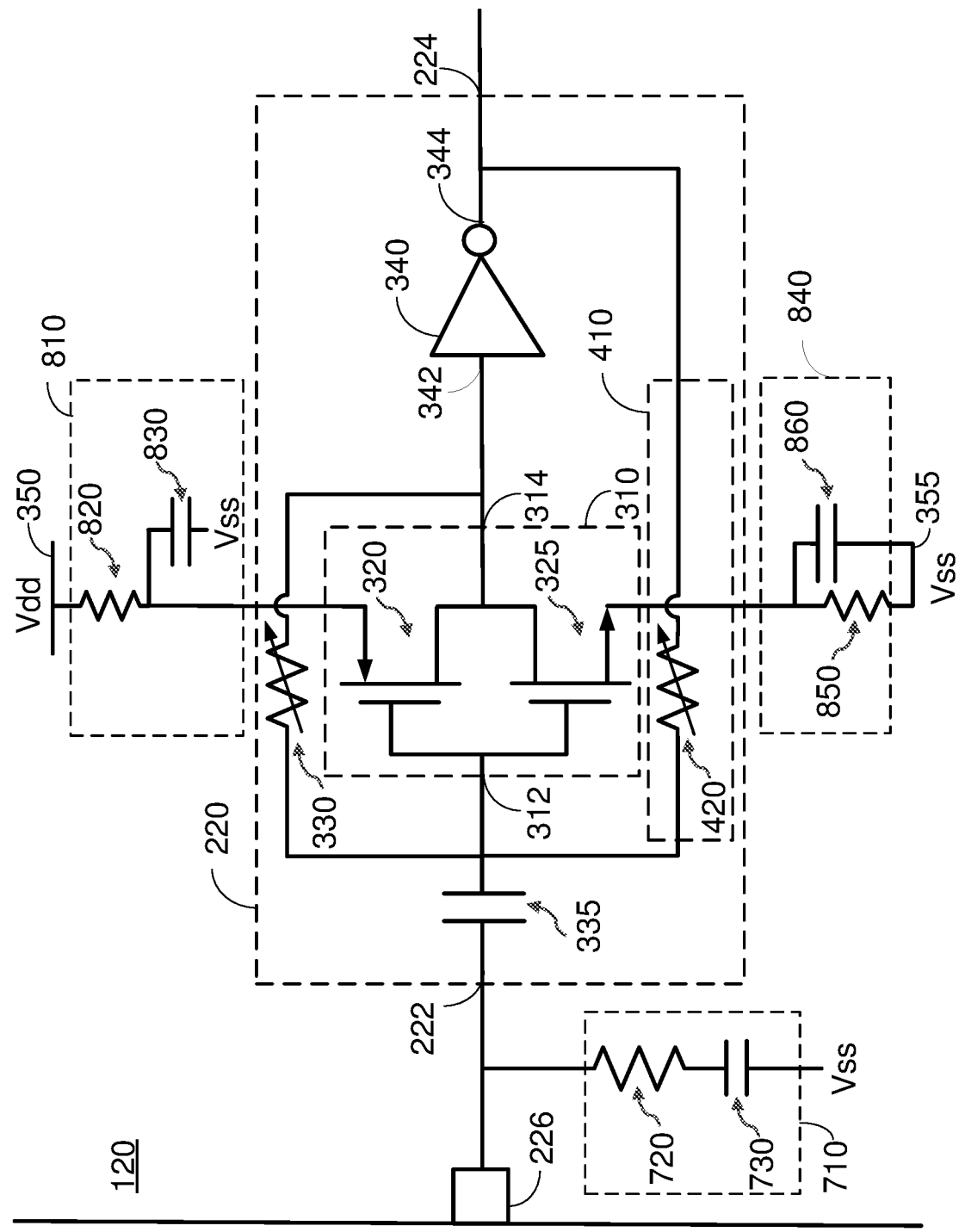
FIG. 8 shows an example of supply-noise filters according to certain aspects of the present disclosure.

FIG. 8 shows an example in which the second chip 120 also includes a first current-limiting resistor 820 coupled between the supply rail 350 and the input stage 310 (e.g., the source of the first transistor 320). In this example, the first current-limiting resistor 820 may be used to regulate the current to the input stage 310 (e.g., across process, voltage, and temperature (PVT) corners). In this example, the resistance of the first current-limiting resistor 820 may be increased to decrease the current and decreased to increase the current. The second chip 120 may also include a second current-limiting resistor 850 coupled between the input stage 310 (e.g., the source of the second transistor 325) and the lower rail 355. The second current-limiting resistor 850 may also be used for current regulation (e.g., across PVT corners). In certain aspects, each of the current-limiting resistors 820 and 850 may be implemented with a resistor having a programmable resistance (e.g., to adjust current regulation).

In the example shown in FIG. 8, the second chip 120 also include a first capacitor 830 having a first terminal coupled between the first current-limiting resistor 820 and the input stage 310 (e.g., source of the first transistor 320) and a second terminal coupled to the lower rail 355 (e.g., ground). In this example, the first capacitor 830 and the first current-limiting resistor 820 form an RC filter 810 that helps filter out noise of the supply rail 350, thereby providing supply noise rejection. In other words, the RC filter 810 helps clean the supply voltage. The second chip 120 may further include a second capacitor 860 coupled in parallel with the second current-limiting resistor 850, in which the second capacitor 860 and the second current-limiting resistor 850 form a second RC filter 840. The second RC filter 840 may be used to reject noise on the lower rail 355.

Figure 9:
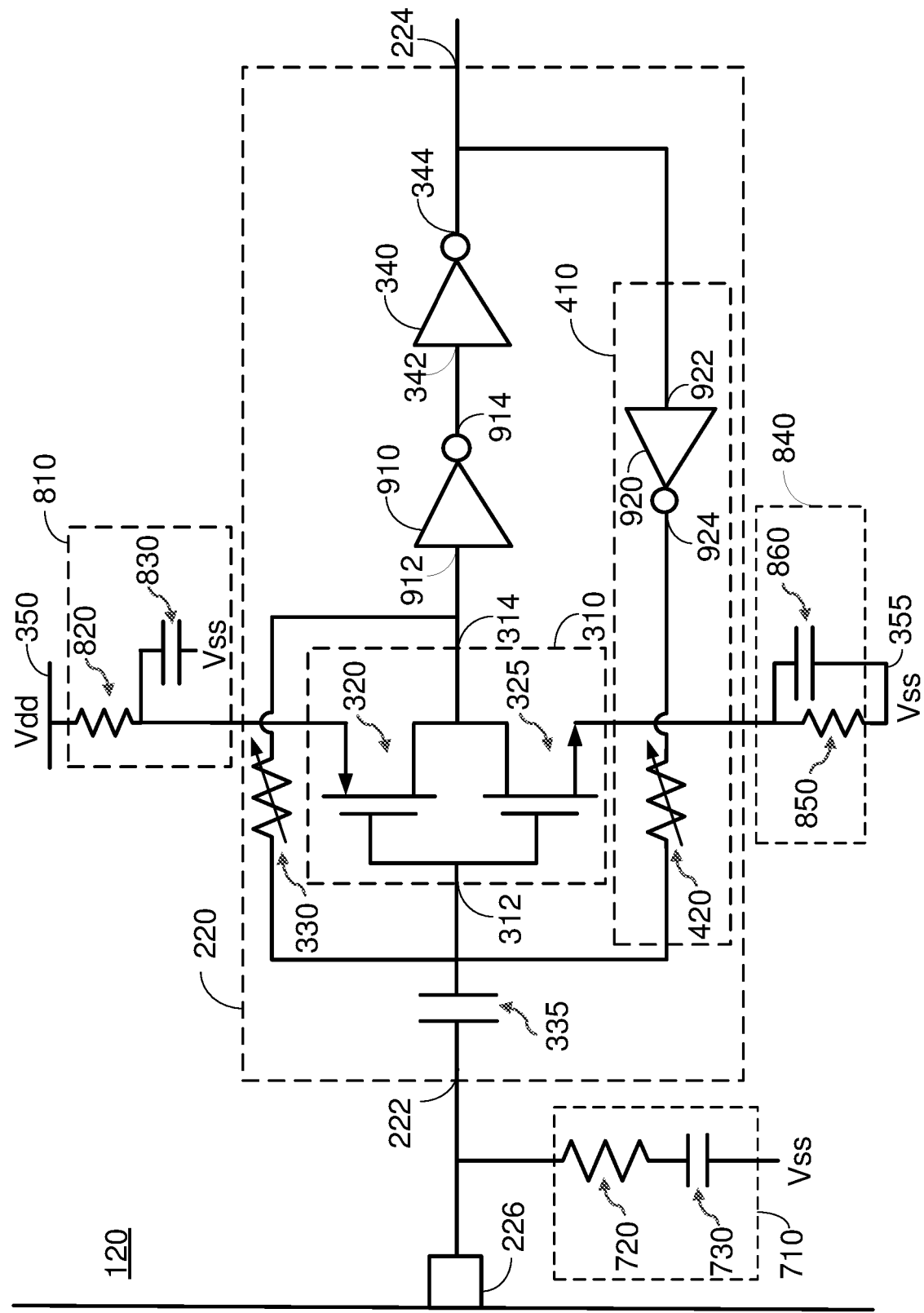
FIG. 9 shows an example of a receiver including an intermediate stage according to certain aspects of the present disclosure.

As discussed above, the receiver 220 may also include one or more intermediate stages coupled between the output 314 of the input stage 310 and the input 342 of the output stage 340. In this regard, FIG. 9 shows an example in which the receiver 220 includes an intermediate stage 910 having an input 912 coupled to the output 314 of the input stage 310 and an output 914 coupled to the input 342 of the output stage 340. Thus, in this example, the input 342 of the output stage 340 is coupled to the output 314 of the input stage 310 via the intermediate stage 910.

In the example in FIG. 9, the intermediate stage 910 is implemented with an inverting circuit. However, it is to be appreciated that the present disclosure is not limited to this example. In the example shown in FIG. 9, the feedback path 410 includes an inverting circuit 920 having an input 922 coupled to the output 344 of the output stage 340 and an output 924 coupled to the second feedback resistor 420. In this example, the inverting circuit 920 is included in the feedback path 410 so that the feedback to the input 312 of the input stage 310 has the same polarity as the data signal.

It is to be appreciated that the second chip 120 may include additional buffers between the output 224 of the receiver 220 and the second processing circuit 228. For example, the second chip 120 may include an inverting buffer (not shown) between the output 244 of the receiver 220 and the second processing circuit 228.

It is to be appreciated that the receiver 220 may include one or more additional components not shown in the examples in FIGS. 4, 6, 7, 8, and 9. For example, in some implementations, the input stage 310 may include one or more resistors between the drains of the transistors 320 and 325. Also, it is to be appreciated that each of the transistors 320 and 325 may be implemented with multiple transistors coupled in parallel.

It is to be appreciated that the present disclosure is not limited to the exemplary terminology used above to describe aspects of the present disclosure. For example, a pad may also be referred to as a pin, an input/output (I/O) pad, an I/O pin, or another term. Also, a processing circuit may also be referred to as a processor, a signal processor, a transmit/receive circuit, an interface, a modem, or another term. A link may also be referred to as a channel, a transmission line, an interconnect, a bus, or another term.

Each of the first processing circuit 218, the second processing circuit 228, and the control circuit 610 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
    a receiver, wherein the receiver comprises:
        an input stage having an input and an output;
        a first resistor coupled between the output of the input stage and the input of the input stage;
        an output stage having an input and an output, wherein the input of the output stage is coupled to the output of the input stage; and
        a feedback path coupled between the output of the output stage and the input of the input stage, the feedback path including a second resistor.
2. The system of clause 1, wherein the first resistor has a first resistance, the second resistor has a second resistance, and the second resistance is larger than the first resistance.
3. The system of clause 2, wherein a ratio of the first resistance over the second resistance is between 0.1 and 0.3.
4. The system of any one of clauses 1 to 3, wherein at least one of the first resistor and the second resistor has a programmable resistance.
5. The system of any one of clauses 1 to 4, wherein the receiver further comprises a coupling capacitor coupled between an input of the receiver and the input of the input stage.
6. The system of clause 5, wherein the receiver is configured to receive a data signal, and a resistance-capacitance (RC) time constant of the first resistor and the coupling capacitor is equal to or less than a unit interval (UI) of the data signal.
7. The system of clause 6, further comprising a termination circuit coupled between the input of the receiver and a rail, the termination circuit comprising:
    a termination resistor; and
    another coupling capacitor, wherein the termination resistor and the other coupling capacitor are coupled in series between the input of the receiver and the rail.
8. The system of any one of clauses 1 to 4, wherein:
    the receiver comprises a first coupling capacitor coupled between an input of the receiver and the input of the input stage; and
    the system further comprises a termination circuit coupled between the input of the receiver and a rail, the termination circuit comprising:
    a termination resistor; and
    a second coupling capacitor, wherein the termination resistor and the second coupling capacitor are coupled in series between the input of the receiver and the rail.
9. The system of clause 8, wherein the rail is coupled to a ground.
10. The system of clause 8 or 9, wherein the receiver is configured to receive a data signal, and a resistance-capacitance (RC) time constant of the first resistor and the first coupling capacitor is equal to or less than a unit interval (UI) of the data signal.
11. The system of clause 10, further comprising a pad coupled to the input of the receiver.
12. The system of any one of clauses 1 to 11, further comprising a current-limiting resistor coupled between the input stage and a first rail.
13. The system of clause 12, further comprising a capacitor having a first terminal and a second terminal, wherein the first terminal is coupled between the current-limiting resistor and the input stage, and the second terminal is coupled to a second rail, the second rail having a lower potential than the first rail.
14. The system of any one of clauses 1 to 13, further comprising:
    a first resistance-capacitance (RC) filter coupled between a first rail and the input stage; and
    a second RC filter coupled between the input stage and a second rail, the second rail having a lower potential than the first rail.
15. The system of any one of clauses 1 to 14, wherein the input stage includes an inverting circuit.
16. The system of clause 15, wherein the inverting circuit comprises:
    a first transistor, wherein a source of the first transistor is coupled to a first rail, a gate of the first transistor is coupled to the input of the input stage, and a drain of the first transistor is coupled to the output of the input stage; and
    a second transistor, wherein a source of the second transistor is coupled to a second rail, a gate of the second transistor is coupled to the input of the input stage, and a drain of the second transistor is coupled to the output of the input stage.
17. The system of any one of clauses 1 to 16, wherein the feedback path further comprises an inverting circuit.
18. The system of any one of clauses 1 to 17, further comprising an intermediate stage having an input and an output, wherein the input of the intermediate stage is coupled to the output of the input stage, and the output of the intermediate stage is coupled to the input of the output stage.
19. The system of clause 18, wherein the input stage comprises a first inverting circuit, and the intermediate stage comprises a second inverting circuit.
20. A system, comprising:
    a first chip, wherein the first chip comprises:
        a driver having an input and an output; and
        a first pad coupled to the output of the driver;
    a second chip, wherein the second chip comprises:

a second pad; and
the receiver in accordance with any one of clauses 1 to 19, the receiver having an input and an output, wherein the input of the receiver is coupled to the second pad; and
a link coupled between the first pad and the second pad.

21. A system, comprising:
a first chip, wherein the first chip comprises:
a driver having an input and an output; and
a first pad coupled to the output of the driver;
a second chip, wherein the second chip comprises:
a second pad; and
a receiver having an input and an output, wherein the input of the receiver is coupled to the second pad, and the receiver comprises:
an input stage having an input and an output;
a first resistor coupled between the output of the input stage and the input of the input stage;
an output stage having an input and an output, wherein the input of the output stage is coupled to the output of the input stage; and
a feedback path coupled between the output of the output stage and the input of the input stage, the feedback path including a second resistor; and
a link coupled between the first pad and the second pad.

22. The system of clause 21, wherein the first resistor has a first resistance, the second resistor has a second resistance, and the second resistance is larger than the first resistance.

23. The system of clause 22, wherein a ratio of the first resistance over the second resistance is between 0.1 and 0.3.

24. The system of any one of clauses 21 to 23, wherein at least one of the first resistor and the second resistor has a programmable resistance.

25. The system of any one of clauses 21 to 24, wherein the receiver further comprises a coupling capacitor coupled between the input of the receiver and the input of the input stage.

26. The system of clause 25, wherein the receiver is configured to receive a data signal, and a resistance-capacitance (RC) time constant of the first resistor and the coupling capacitor is equal to or less than a unit interval (UI) of the data signal.

27. The system of clause 26, wherein the second chip further comprises a termination circuit coupled between the input of the receiver and a rail, the termination circuit comprising:
a termination resistor; and
another coupling capacitor, wherein the termination resistor and the other coupling capacitor are coupled in series between the input of the receiver and the rail.

28. The system of any one of clauses 21 to 24, wherein:
the receiver comprises a first coupling capacitor coupled between the input of the receiver and the input of the input stage; and
the second chip further comprises a termination circuit coupled between the input of the receiver and a rail, the termination circuit comprising:
a termination resistor; and
a second coupling capacitor, wherein the termination resistor and the second coupling capacitor are coupled in series between the input of the receiver and the rail.

29. The system of clause 28, wherein the rail is coupled to a ground.

30. The system of clause 28 or 29, wherein the receiver is configured to receive a data signal, and a resistance-capacitance (RC) time constant of the first resistor and the first coupling capacitor is equal to or less than a unit interval (UI) of the data signal.

31. The system of any one of clauses 21 to 30, wherein the second chip further comprises a current-limiting resistor coupled between the input stage and a first rail.

32. The system of clause 31, wherein the second chip further comprises a capacitor having a first terminal and a second terminal, wherein the first terminal is coupled between the current-limiting resistor and the input stage, and the second terminal is coupled to a second rail, the second rail having a lower potential than the first rail.

33. The system of any one of clauses 21 to 32, wherein the second chip further comprises:
a first resistance-capacitance (RC) filter coupled between a first rail and the input stage; and
a second RC filter coupled between the input stage and a second rail, the second rail having a lower potential than the first rail.

34. The system of any one of clauses 21 to 33, wherein the input stage includes an inverting circuit.

35. The system of clause 34, wherein the inverting circuit comprises:
a first transistor, wherein a source of the first transistor is coupled to a first rail, a gate of the first transistor is coupled to the input of the input stage, and a drain of the first transistor is coupled to the output of the input stage; and
a second transistor, wherein a source of the second transistor is coupled to a second rail, a gate of the second transistor is coupled to the input of the input stage, and a drain of the second transistor is coupled to the output of the input stage.

36. The system of any one of clauses 21 to 35, wherein the feedback path further comprises an inverting circuit.

37. The system of any one of clauses 21 to 36, wherein the receiver further comprises an intermediate stage having an input and an output, wherein the input of the intermediate stage is coupled to the output of the input stage, and the output of the intermediate stage is coupled to the input of the output stage.

38. The system of clause 37, wherein the input stage comprises a first inverting circuit, and the intermediate stage comprises a second inverting circuit.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a receiver, wherein the receiver comprises:
an input stage having an input and an output, wherein the input of the input stage is configured to receive a data signal;
a first resistor coupled between the output of the input stage and the input of the input stage;
an output stage having an input and an output, wherein the input of the output stage is coupled to the output of the input stage; and
a feedback path coupled between the output of the output stage and the input of the input stage, the feedback path including a second resistor, wherein the feedback path is configured to provide feedback to the input of the input stage having a same polarity as the data signal.

2. The system of claim 1, wherein the first resistor has a first resistance, the second resistor has a second resistance, and the second resistance is larger than the first resistance.

3. The system of claim 2, wherein a ratio of the first resistance over the second resistance is between 0.1 and 0.3.

4. The system of claim 1, wherein at least one of the first resistor and the second resistor has a programmable resistance.

5. The system of claim 1, wherein the receiver further comprises a coupling capacitor coupled between an input of the receiver and the input of the input stage.

6. The system of claim 5, wherein a resistance-capacitance (RC) time constant of the first resistor and the coupling capacitor is equal to or less than a unit interval (UI) of the data signal.

7. The system of claim 1, wherein:
the receiver comprises a first coupling capacitor coupled between an input of the receiver and the input of the input stage; and
the system further comprises a termination circuit coupled between the input of the receiver and a rail, the termination circuit comprising:
a termination resistor, and
a second coupling capacitor, wherein the termination resistor and the second coupling capacitor are coupled in series between the input of the receiver and the rail.

8. The system of claim 7, wherein the rail is coupled to a ground.

9. The system of claim 7, wherein a resistance-capacitance (RC) time constant of the first resistor and the first coupling capacitor is equal to or less than a unit interval (UI) of the data signal.

10. The system of claim 9, further comprising a pad coupled to the input of the receiver.

11. The system of claim 1, further comprising a current-limiting resistor coupled between the input stage and a first rail.

12. The system of claim 11, further comprising a capacitor having a first terminal and a second terminal, wherein the first terminal is coupled between the current-limiting resistor and the input stage, and the second terminal is coupled to a second rail, the second rail having a lower potential than the first rail.

13. The system of claim 1, further comprising:
a first resistance-capacitance (RC) filter coupled between a first rail and the input stage; and
a second RC filter coupled between the input stage and a second rail, the second rail having a lower potential than the first rail.

14. The system of claim 1, wherein the input stage includes an inverting circuit.

15. The system of claim 14, wherein the inverting circuit comprises:
a first transistor, wherein a source of the first transistor is coupled to a first rail, a gate of the first transistor is coupled to the input of the input stage, and a drain of the first transistor is coupled to the output of the input stage; and
a second transistor, wherein a source of the second transistor is coupled to a second rail, a gate of the second transistor is coupled to the input of the input stage, and a drain of the second transistor is coupled to the output of the input stage.

16. The system of claim 1, wherein the feedback path further comprises an inverting circuit.

17. The system of claim 1, further comprising an intermediate stage having an input and an output, wherein the input of the intermediate stage is coupled to the output of the input stage, and the output of the intermediate stage is coupled to the input of the output stage.

18. The system of claim 17, wherein the input stage comprises a first inverting circuit, and the intermediate stage comprises a second inverting circuit.

19. A system, comprising:
a first chip, wherein the first chip comprises:
a driver having an input and an output, wherein the driver is configured to output a data signal at the output of the driver; and
a first pad coupled to the output of the driver;
a second chip, wherein the second chip comprises:
a second pad; and
a receiver having an input and an output, wherein the input of the receiver is coupled to the second pad, and the receiver comprises:
an input stage having an input and an output, wherein the input of the input stage is configured to receive the data signal;
a first resistor coupled between the output of the input stage and the input of the input stage;
an output stage having an input and an output, wherein the input of the output stage is coupled to the output of the input stage; and
a feedback path coupled between the output of the output stage and the input of the input stage, the feedback path including a second resistor, wherein the feedback path is configured to provide feedback to the input of the input stage having a same polarity as the data signal; and
a link coupled between the first pad and the second pad.

20. The system of claim 19, wherein the first resistor has a first resistance, the second resistor has a second resistance, and the second resistance is larger than the first resistance.

21. The system of claim 20, wherein a ratio of the first resistance over the second resistance is between 0.1 and 0.3.

22. The system of claim 19, wherein at least one of the first resistor and the second resistor has a programmable resistance.

23. The system of claim 19, wherein the receiver further comprises a coupling capacitor coupled between the input of the receiver and the input of the input stage.

24. The system of claim 23, wherein a resistance-capacitance (RC) time constant of the first resistor and the coupling capacitor is equal to or less than a unit interval (UI) of the data signal.

25. The system of claim 19, wherein:
the receiver comprises a first coupling capacitor coupled between the input of the receiver and the input of the input stage; and
the second chip further comprises a termination circuit coupled between the input of the receiver and a rail, the termination circuit comprising:
a termination resistor, and
a second coupling capacitor, wherein the termination resistor and the second coupling capacitor are coupled in series between the input of the receiver and the rail.

26. The system of claim 25, wherein the rail is coupled to a ground.

27. The system of claim 25, wherein a resistance-capacitance (RC) time constant of the first resistor and the first coupling capacitor is equal to or less than a unit interval (UI) of the data signal.

28. The system of claim 19, wherein the second chip further comprises a current-limiting resistor coupled between the input stage and a first rail.

29. The system of claim 28, wherein the second chip further comprises a capacitor having a first terminal and a second terminal, wherein the first terminal is coupled between the current-limiting resistor and the input stage, and the second terminal is coupled to a second rail, the second rail having a lower potential than the first rail.

30. The system of claim 19, wherein the second chip further comprises:
a first resistance-capacitance (RC) filter coupled between a first rail and the input stage; and
a second RC filter coupled between the input stage and a second rail, the second rail having a lower potential than the first rail.

31. The system of claim 19, wherein the input stage includes an inverting circuit.

32. The system of claim 31, wherein the inverting circuit comprises:
a first transistor, wherein a source of the first transistor is coupled to a first rail, a gate of the first transistor is coupled to the input of the input stage, and a drain of the first transistor is coupled to the output of the input stage; and
a second transistor, wherein a source of the second transistor is coupled to a second rail, a gate of the second transistor is coupled to the input of the input stage, and a drain of the second transistor is coupled to the output of the input stage.

33. The system of claim 19, wherein the feedback path further comprises an inverting circuit.

34. The system of claim 19, wherein the receiver further comprises an intermediate stage having an input and an output, wherein the input of the intermediate stage is coupled to the output of the input stage, and the output of the intermediate stage is coupled to the input of the output stage.

35. The system of claim 34, wherein the input stage comprises a first inverting circuit, and the intermediate stage comprises a second inverting circuit.

* * * * *